US 6,869,821 B2

(12) United States Patent
Knipp et al.

(10) Patent No.: US 6,869,821 B2
(45) Date of Patent: Mar. 22, 2005

(54) METHOD FOR PRODUCING ORGANIC ELECTRONIC DEVICES ON DEPOSITED DIELECTRIC MATERIALS

(75) Inventors: Dietmar P. Knipp, Bremen (DE); John E. Northrup, Palo Alto, CA (US); Robert A. Street, Palo Alto, CA (US)

(73) Assignee: Xerox Corporation, Stamford, CT (US)

( * ) Notice: Subject to any disclaimer, the term of this patent is extended or adjusted under 35 U.S.C. 154(b) by 39 days.

(21) Appl. No.: 10/335,598

(22) Filed: Dec. 30, 2002

(65) Prior Publication Data

US 2004/0124416 A1 Jul. 1, 2004

(51) Int. Cl.$^7$ .......................... H01L 51/40; H01L 35/24; H01L 51/00
(52) U.S. Cl. .......................................... 438/99; 257/40
(58) Field of Search .............................. 438/99; 257/40

(56) References Cited

U.S. PATENT DOCUMENTS

| | | | |
|---|---|---|---|
| 5,347,144 | A | 9/1994 | Garnier et al. |
| 5,981,970 | A | 11/1999 | Dimitrakopoulos et al. |
| 6,207,472 | B1 | 3/2001 | Callegari et al. |
| 6,215,130 | B1 | 4/2001 | Dodabalapur |
| 6,734,038 | B2 * | 5/2004 | Shtein et al. ................. 438/99 |
| 2002/0180372 | A1 * | 12/2002 | Yamazaki ................ 315/169.3 |
| 2003/0085397 | A1 * | 5/2003 | Geens et al. ................... 257/40 |
| 2003/0116719 | A1 * | 6/2003 | Miyazawa ............... 250/484.2 |

OTHER PUBLICATIONS

Schon et al. "Efficient photovoltaic energy conversion in pentacene–based heterojunctions," Applied Physics Letters, vol. 77, No. 16, Oct. 16, 2000, pp. 2473–2475.

Lin et al. "Stacked Pentacene Layer Organic Thin–Film Transistors with Improved Characteristics," IEEE Electron Device Letters, vol. 18, No. 12, Dec. 1997, pp. 606–608.

Kloc et al. "Physical vapor growth of centimeter–sized crystals of α–hexathiophene," Journal of Crystal Growth 182 (1997) 416–427.

Laudise et al. "Physical vapor growth of organic semiconductors," Journal of Crystal Growth 187 (1998) 449–454.

Bao et al. "High–Performance Plastic Transistors Fabricated by Printing Techniques," Chem. Mater., vol. 9, No. 6, 1997, pp. 1299–1301.

Sirringhaus et al. "High Resolution Inkjet Printing of All–Polymer Transistor Circuits," Science, vol. 290, Dec. 15, 2000, pp. 2123–2126.

Kagan et al. "Organic–Inorganic Hybrid Materials as Semiconducting Channels in Thin–Film Field–Effect Transistors," Science, vol. 286, Oct. 29, 1999, pp. 945–947.

Brown et al. "Field–effect transistors made from solution–processed organic semiconductors," Synthetic Metals 88 (1997) 37–55.

Leitner et al. "Investigations of the Growth of Self–Assembled Octadecylsiloxane Monolayers with Atomic Force Microscopy," Mikrochimica Acta 133 (2000) 331–336.

(List continued on next page.)

Primary Examiner—Erik Kielin
(74) Attorney, Agent, or Firm—Bever, Hoffman & Harms; Patrick T. Bever

(57) ABSTRACT

A deposited dielectric (e.g., PECVD silicon nitride) formed on an inexpensive glass or plastic foil substrate is modified to facilitate the formation of high mobility organic semiconductor films. In one embodiment, the dielectric is plasma treated using nitrogen or argon gas to reduce the surface roughness of the dielectric layer below 5 nm (peak-to-valley). An organic semiconductor film (e.g., pentacene) grown on the modified dielectric exhibits high mobility and large polycrystalline grain sizes.

17 Claims, 3 Drawing Sheets

OTHER PUBLICATIONS

Vallant et al. "Formation of Self–Assembled Octadecylsiloxane Monolayers on Mica and Silicon Surfaces Studied by Atomic Force Microscopy and Infrared Spectroscopy," J. Phys. Chem. B, vol. 102, No. 37, 1998, pp. 7190–7197.

Hasegawa et al. "Initial Growth of Polycrystalline Silicon Films on Substrates Subjected to Different Plasma Treatments," Jpn. J. Appl. Phys., vol. 37 (1998) Pt. 1, No. 9A, pp. 4711–4717.

Schon et al. "Ambipolar Pentacene Field–Effect Transistors and Inverters," Science, vol. 287, Feb. 11, 2000, pp. 1022–1023.

Jentzsch et al. "Efficiency of optical second harmonic generation from pentacene films of different morphology and structure," Thin Solid Films 315 (1998) 273–280.

Seto, John Y. W. "The electrical properties of polycrystalline silicon films," Journal of Applied Physics, vol. 46, No. 12, Dec. 1975, pp. 5247–5254.

Levinson et al. "Conductivity behavior in polycrystalline semiconductor thin film transistors," J. Appl. Phys., vol. 53, No. 2, Feb. 1982, pp. 1193–1202.

Klauk et al. "Deposition: Pentacene organic thin–film transistors and ICs," Solid State Technology, Mar. 2000, 9 pages.

Dimitrakopoulos et al. "Low–Voltage Organic Transistors on Plastic Comprising High–Dielectric Constant Gate Insulators," Science, vol. 283, Feb. 5, 1999, pp. 822–824.

Schon et al. "Trapping in organic field–effect transistors," Journal of Applied Physics, vol. 89, No. 1, Jan. 1, 2001, pp. 336–342.

Street et al. "Hole transport in polycrystalline pentacene transistors," Applied Physics Letters, vol. 80, No. 9, Mar. 4, 2002, pp. 1658–1660.

Yang et al. "Deep–level defect characteristics in pentacene organic thin films," Applied Physics Letters, vol. 80, No. 9, Mar. 4, 2002, pp. 1595–1597.

Schon, Jan Hendrik "On the stability of organic field–effect transistor materials," Applied Physics Letters, vol. 79, No. 25, Dec. 17, 2001, pp. 4163–4164.

* cited by examiner

METHOD FOR PRODUCING ORGANIC ELECTRONIC DEVICES ON DEPOSITED DIELECTRIC MATERIALS

FIELD OF THE INVENTION

This invention relates to methods for producing organic films, and more particularly to methods for producing organic semiconductor films on deposited dielectric layers.

BACKGROUND OF THE INVENTION

Organic semiconductor materials are interesting candidates for large area electronic applications, such as smart cards, information tags, flat panel displays or large area sensors. Up to now polyacenes (e.g., naphthalene, anthracene, tetracene and pentacene) have demonstrated the best performance of organic materials in terms of mobility, speed and on/off ratio. These organic materials exhibit a high tendency to form highly ordered films, which can be poly or single crystalline depending on the deposition and substrate conditions.

Different methods have been proposed to realize organic thin film transistors (TFTs) with good electronic properties. For example, vapor phase deposition, thermal deposition, and solution based (spin, dip casting, ink jet printing technologies) fabrication techniques have been explored by various entities. In the case of vapor phase deposition, the organic single crystals are grown in a stream of gas (carrier gas), which transfers the vaporized material from the source to the substrate. The realized transistor structures exhibit high mobilities of 2–3 $cm^2/Vs$. However, this deposition method cannot be applied to large areas, which are of interest for low cost electronics. Solution based processes are an alternative to the vapor phase deposition. Spinning and dip casting on one hand and ink jet printing on the other hand are promising methods to realize low cost electronics on low cost substrates. In the case of direct printing of the semiconductor material, the organic film can be prepared and patterned in one step. However, the mobility of the solution based polyacene TFTs is at least one order of magnitude reduced due to the structural disorder of the film (0.1 $cm^2/Vs$).

Thermal evaporation is the third fabrication method for producing organic TFTs, and the one used most widely. In this case, the organic material is vaporized under high vacuum conditions and deposited on a heated substrate. The mobility ranges from 0.2 $cm^2/Vs$ to 1.4 $cm^2/Vs$. Thermal evaporation of organic films is a very promising method for large area electronics, because the fabrication process combines the advantage of good material properties with the ability to realize transistor devices on large area substrates.

The performance of organic TFTs, specifically the carrier mobility, depends highly on the structural order of the organic film, which is determined both during formation and by subsequent processing. Regardless of the method used to form the organic film, the structural order of an organic film depends strongly on the surface properties of the underlying material on which the organic material is formed. That is, the surface morphology and the chemistry of the underlying material have an influence on the subsequent growth of the organic film. Furthermore, it is difficult to pattern the organic films without affecting the electronic properties. Therefore, bottom-gate (inverted) transistor arrangements, in which the organic semiconductor film is formed on a dielectric layer that overlies a gate electrode, are the preferred organic TFT design. Further, conventional bottom-gate organic TFTs are typically fabricated on thermal oxide dielectric layers grown on monocrystalline silicon substrates. Such thermal oxides provide superior surface properties that have been used to produce organic TFTs exhibiting high carrier mobility. Therefore, most organic semiconductor devices are currently formed on thermal oxide grown on silicon wafers.

A problem with utilizing organic semiconductor materials for large area electronic applications is that silicon wafers are not practical for large area applications, and large area compatible inorganic dielectrics such as PECVD silicon nitride and silicon oxide are generally found to produce inferior organic TFTs. Typical inexpensive large area substrates (e.g., plastic foil or glass) do not support the growth of thermal oxide, so dielectric materials must be deposited using, for example, Plasma Enhanced Chemical Vapor Deposition (PECVD) techniques. These deposited dielectric materials (e.g., silicon nitride, silicon oxide, or silicon oxy-nitride) are known good dielectric materials for the formation of amorphous silicon and polysilicon transistors, but have been found to be unsuitable for the formation of highly ordered organic films. Therefore, organic semiconductor devices produced on inexpensive large area substrates have inferior performance characteristics when compared to organic semiconductor devices formed on thermally grown oxides.

What is needed is a method for producing organic semiconductor materials on deposited dielectrics that provide similar performance characteristics to organic semiconductor materials formed on thermally grown oxides.

SUMMARY OF THE INVENTION

The present invention is directed to a method for producing organic semiconductor films on deposited dielectrics in which the dielectric surface is modified (e.g., subjected to plasma treatment or another smoothing process) before depositing the organic semiconductor material. By treating the dielectric surface, the present inventors have been able to produce organic (e.g., pentacene) films on deposited dielectrics (e.g., PECVD silicon nitride, silicon oxide, or silicon oxy-nitride) having substantially larger grain size and substantially higher carrier mobility than organic films formed on untreated deposited dielectric materials, thereby providing organic TFTs having performance characteristics similar to conventional organic TFTs formed on thermal oxides.

According to an embodiment of the present invention, a method for producing an organic electronic device includes depositing a dielectric material over a substrate, plasma treating the dielectric material until a surface roughness of the dielectric material is equal to or less than 5 nm (peak-to-valley, as this term is used in the field of Atomic Force Microscopy (AFM)), and then depositing an organic semiconductor material over the treated dielectric material. To form a bottom-gate TFT structure, a gate electrode is formed on the substrate prior to forming the dielectric layer. Drain and source contacts can either be formed on the dielectric material prior to plasma treatment, or after deposition of the organic material.

According to another embodiment of the present invention, a method for producing an organic TFT includes forming a bottom gate structure on a substrate (e.g., plastic foil or glass), forming an amorphous inorganic dielectric (e.g., PECVD silicon nitride, silicon oxide, or silicon oxy-nitride) having a thickness in the range of 10 to 500 nm, and then smoothing the dielectric surface using, for example, plasma treatment or another suitable process (e.g., sputtering, etching, or chemical mechanical polishing (CMP)). The smoothing process is performed until the roughness of the dielectric is less than 5 nm (peak-to-valley), thereby improving the ordering and increasing the crystal size of the subsequently formed polyacene-based material. Next, an organic film is formed utilizing a conventional method (e.g., thermally deposited polyacene-based material) to form the channel of the organic TFT. The resulting organic TFT device exhibits a significantly increased mobility and on/off ratio when compared to organic TFT devices formed on untreated deposited dielectrics. Hence, the present invention facilitates the realization of high mobility organic thin film transistors on large area/low cost substrates.

According to yet another embodiment of the present invention, a large-area electronic device including an inexpensive substrate (e.g., plastic foil, metal foil, or glass, as compared with monocrystalline silicon), an amorphous inorganic dielectric layer (e.g., PECVD silicon nitride, silicon oxide, or silicon oxy-nitride) formed over the substrate and having a thickness in the range of 10 to 500 nm and a surface roughness that is less than 5 nm (peak-to-valley), and an organic film (e.g., thermally deposited polyacene-based material such as pentacene) formed on the dielectric layer. The large-area electronic device includes bottom-gate organic TFTs formed by gate structures formed between the substrate and the dielectric layer, and source/drain structures either formed between the dielectric layer and organic film, or on top of the organic film.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is described below with reference to certain specific embodiments that disclose its novel aspects. While these specific embodiments are primarily directed to the formation of bottom-gate organic Thin-Film Transistors (TFTs) in which pentacene is formed on an inorganic amorphous dielectric, those familiar with semiconductor fabrication will recognize that novel aspects of the present invention may be utilized to produce a wide range of organic electronic structures.

Figure 1:
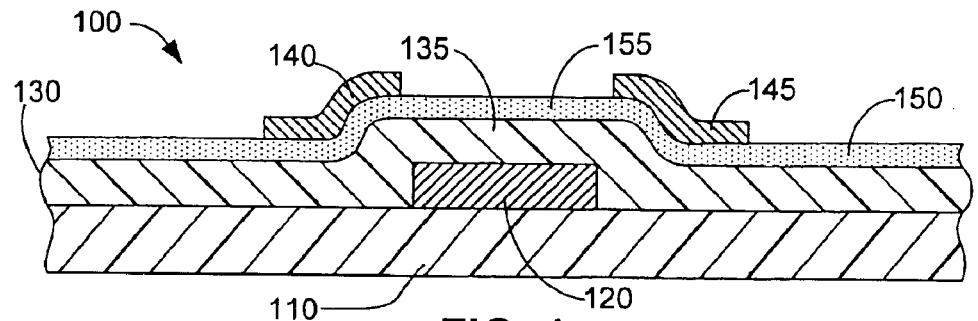
FIG. 1 is a cross-sectional side view showing an exemplary organic TFT produced according to the present invention.

FIG. 1 is a cross-sectional side view showing a bottom-gate organic TFT 100, which represents a portion of a large area electronic device that is fabricated according to an embodiment of the present invention. Organic TFT 100 includes an electrically conductive gate structure 120 formed on a substrate 110, a dielectric layer 130 formed over substrate 110 and including a gate dielectric portion 135 located over gate structure 120, an organic semiconductor layer 150 forming a channel region 155, and electrically conductive source/drain structures 140 and 145 formed on organic semiconductor layer 150 at each end of gate dielectric portion 135. Organic TFT 100 may be incorporated, for example, in a large area electronic application such as a smart card, an information tag, a flat panel display, or a large-area sensor.

As discussed above, large area electronic applications typically utilize low cost substrates, such as flexible plastic foils, metal foils or glass, instead of the more expensive monocrystalline silicon utilized in the production of conventional integrated circuit devices. A problem that arises with respect to forming organic semiconductor devices on these inexpensive substrates is that dielectric materials must be deposited (e.g., using PECVD or evaporation techniques) instead of being thermally grown oxide, and such deposited dielectrics have surface characteristics that do not support the formation of organic films exhibiting high mobility. Therefore, according to the present invention, the upper surface of dielectric layer 130 of organic TFT 100 (FIG. 1) is modified prior to the formation of organic semiconductor layer 150, thereby facilitating the formation of high mobility organic TFTs on large area/low cost substrates.

FIGS. 2(A) through 2(E) are cross-sectional side views showing a method for fabricating organic TFT 100 according to an embodiment of the present invention.

Figure 2A:
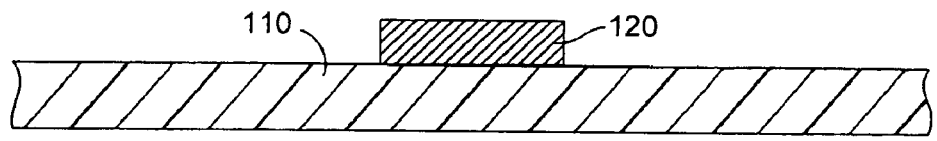
FIGS. 2(A) through 2(E) are cross-sectional side views showing a method for fabricating the organic TFT of FIG. 1 according to an embodiment of the present invention.

Referring to FIG. 2(A), the fabrication process begins by forming gate structure 120 on substrate 110. Because the present invention is primarily directed to the production of large area electronic applications, substrate 110 is optimized for large area and/or low cost electronics. Accordingly, in one embodiment, substrate 110 includes a flexible plastic foil, metal foil or glass, which are commonly used for large area electronic applications, as contrasted to more expensive monocrystalline silicon typically utilized in the production of conventional integrated circuit devices. Gate structure 120 is formed on substrate 110 using standard photolithography, by directly printing metal onto substrate 110, or alternatively using printing using wax masks, as disclosed in co-owned and co-pending U.S. patent application Ser. No. 09/838,684, filed Apr. 19, 2001, entitled "METHOD FOR PRINTING ETCH MASKS USING PHASE-CHANGE MATERIALS", which is incorporated herein in its entirety.

Figure 2B:
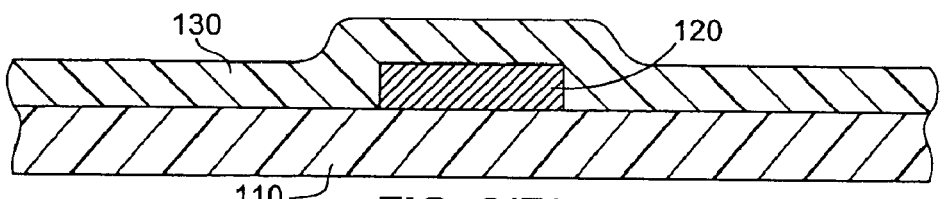

Referring to FIG. 2(B), dielectric layer 130 is then deposited over exposed surfaces of substrate 110 and gate structure 120. In one embodiment, dielectric layer 130 is an amorphous inorganic dielectric material having a typical thickness in the range of 10 to 500 nm and deposited using PECVD, hot wire, sputter, or laser deposition techniques. The present inventors primarily studied PECVD amorphous silicon nitride, silicon oxide and silicon oxy-nitride in connection with the development of the present invention, but believe that other dielectrics and other deposition techniques will benefit from the present invention in a manner similar to that described herein.

Depending on the device structure, drain/source contacts 140 and 145 are formed either before or after the deposition of the organic material, and are formed using well-known techniques. As indicated in FIG. 2(E) (discussed below), in the case of an inverted staggered structure, drain/source contacts 140 and 145 are formed after depositing the organic material. As described with reference to FIGS. 3(A) through 3(E), in another embodiment the drain/source contacts may be formed before modifying the surface of the dielectic material and before depositing the organic material.

Figure 2C:
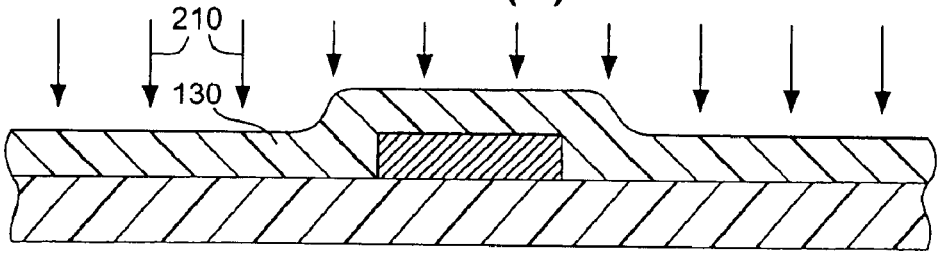

As indicated in FIG. 2(C), according to aspect of the present invention, the upper surface of dielectric layer 130 is then modified to facilitate the subsequent formation of organic semiconductor material such that the organic material exhibits high mobility and large grain size. The inventors presently believe the mechanism by which these superior organic semiconductor material characteristics are achieved is the reduction in surface roughness of dielectric layer 130 (herein referred to as "smoothing"). When formed using conventional PECVD deposition techniques on inexpensive substrates (e.g., glass) to a thickness of 100–500 nm, typical dielectric surface roughness is approximately 10 nm (peak-to-valley). The present inventors currently believe that plasma treatment, particularly under the conditions described below, facilitates superior organic semiconductor formation by reducing the surface roughness of dielectric layer 130 to less than 5 nm (peak-to-valley), which was found to facilitate the formation of suitable organic films, as described below. However, the "smoothing" operation of the present invention is not limited to plasma treatment, and beneficial dielectric surface smoothness may be achieved using other techniques (e.g., sputtering, etching, or CMP). Moreover, the present inventors believe that it may be possible to facilitate superior organic semiconductor formation by chemical interactions generated as a result of the plasma treatment process.

In accordance with the specific embodiment depicted in FIG. 2(C), plasma treatment is performed using a capacitive coupled reactor (not shown) in which a gas 210 is utilized to produce the plasma. Table 1 (below) lists reactor conditions utilized to generate suitable dielectric surface modifications. In particular, the two parallel electrodes of the reactor have an electrode spacing of 1–3 cm. The gases nitrogen ($N_2$), Argon (Ar), Hydrogen ($H_2$), and Oxygen ($O_2$) were tested. Power densities of 10–15 mW/cm$^2$ and a gas pressure in the range of 200 to 500 mTorr were utilized, and the gas flow ranged from 100–200 sccm.

TABLE 1

Conditions for Plasma Treatment

| Gases | $N_2$, Ar, $H_2$ and $O_2$ |
|---|---|
| Pressure (mTorr) | 200–500 |
| Flow (sccm) | 100–200 |
| Power (mW/cm$^2$) | 10–15 |

In accordance with another aspect of the present invention, plasma treatment under the conditions set forth above that utilized nitrogen ($N_2$) or Argon (Ar) was found to produce particularly beneficial dielectric surface conditions, as compared to $H_2$ and $O_2$. In particular, $N_2$ and Ar were found to produce distinct reductions of the dielectric surface roughness, with $N_2$ producing the best results. In contrast, $H_2$ has only a minor effect on the topology of dielectric layer 130, and oxygen plasma even reduced the performance of the organic TFTs. The inventors note, however, that although $N_2$ and Ar were experimentally determined to produce superior dielectric surface conditions, beneficial results were obtained by mixing these gases with, for example, $H_2$. Further, other yet-to-be-tested gases and gas mixtures may be identified that produce even better dielectric surface conditions than those provided by $N_2$ and Ar.

Figure 2D:
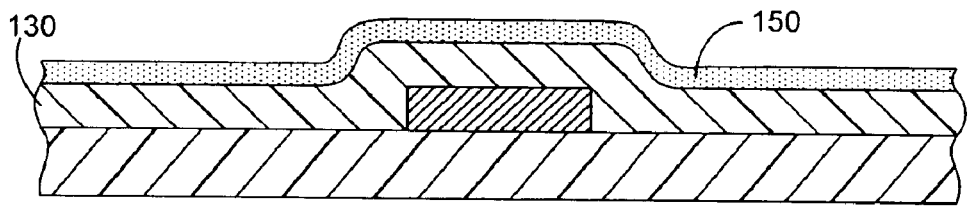
Figure 2E:
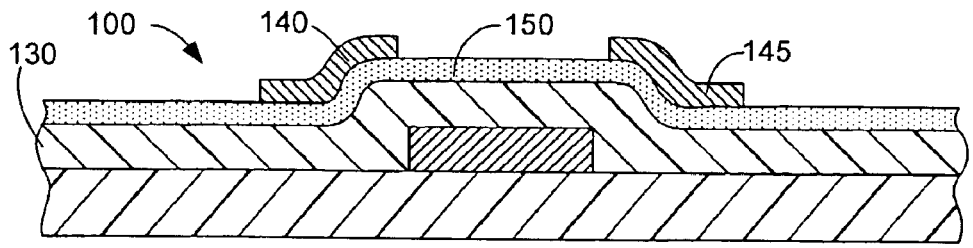
Figure 3A:
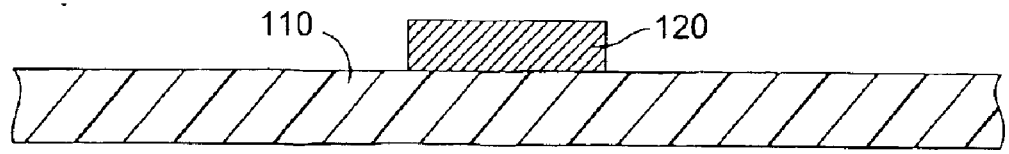
FIGS. 3(A) through 3(E) are cross-sectional side views showing a method for fabricating an organic TFT according to another embodiment of the present invention.
Figure 3B:
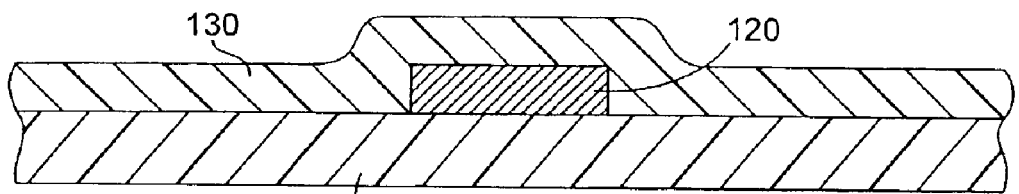
Figure 3C:
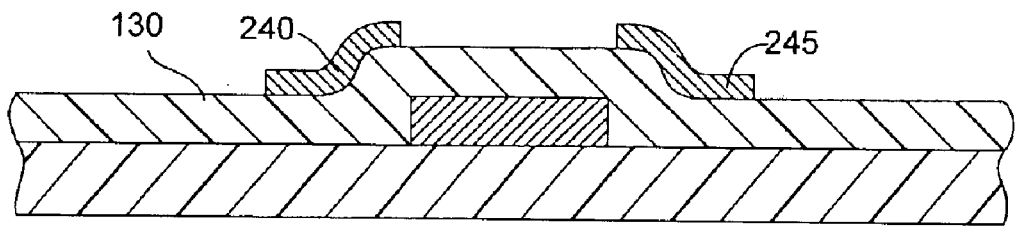
Figure 3D:
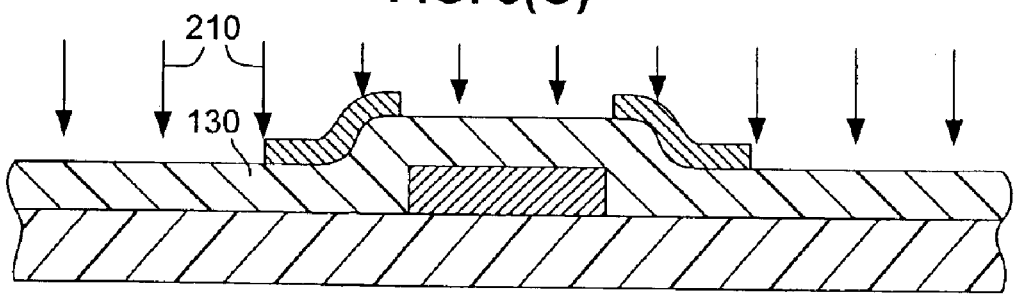
Figure 3E:
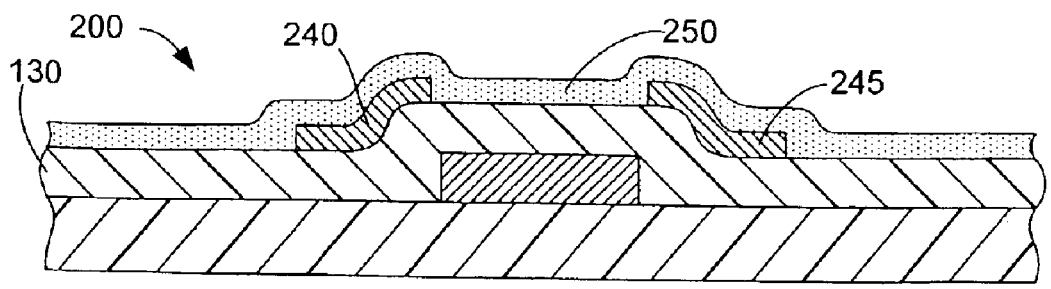

Referring to FIG. 2(D), organic semiconductor layer 150 is then deposited onto the modified dielectric layer 130 utilizing conventional methods (e.g., vapor phase deposition, thermal deposition, solution based fabrication techniques, or thermal evaporation). In one embodiment, polyacene-based molecules are thermally deposited to form channel 155 of organic TFT 100. The dielectric modification process (described above) is believed to improve the molecule ordering, and to increase the crystal size of the polyacene-based grains. Consequently, the mobility and the on/off ratio of the resulting organic TFT 100 are distinctly increased over organic TFTs formed on unmodified deposited dielectrics. Finally, as indicated in FIG. 2(E), source/drain structures 140 and 145 are formed over organic semiconductor layer 150 using known techniques that maintain the high mobility of organic semiconductor layer 150. Hence, the present invention facilitates the realization of high mobility organic TFTs on large area/low cost substrates.

FIGS. 3(A) through 3(E) are cross-sectional side views showing a method for fabricating an inverted coplanar organic TFT 200 according to another embodiment of the present invention. As mentioned above, an organic TFT could have an inverted staggered structure (e.g., organic TFT 100, described above), or could have the inverted coplanar structure shown in FIG. 3(E). In this case, the formation of gate structure 120 on substrate 110 (FIG. 3(A)) and the deposition of dielectric layer 130 (FIG. 3(B)) are essentially identical to the embodiment described above. However, the formation of drain and source structures 240 and 245 (FIG. 3(C)) is performed before dielectric surface modification (FIG. 3(D)) using the techniques described above (e.g., plasma treatment using gas 210), and before an organic semiconductor layer 250 is deposited (FIG. 3(E)) in the manner described above. Alternatively, although not shown, dielectric surface modification using the techniques described above (e.g., plasma treatment using gas 210) may be performed before the formation of drain and source structures 240 and 245, followed by deposition of organic semiconductor layer 250.

Other modifications to the method may also be incorporated. For example, the process could also be combined with a chemical treatment, such as a self-assembly-monolayer (SAM) treatment of the substrate or dielectric, which leads to an additional increase of the mobility. In addition, TFTs fabricated from other organic materials (e.g., polymers) also require ordered films to give good properties, so a plasma treatment similar to that described herein may be effective in producing polymer-based organic TFTs.

Figure 4:
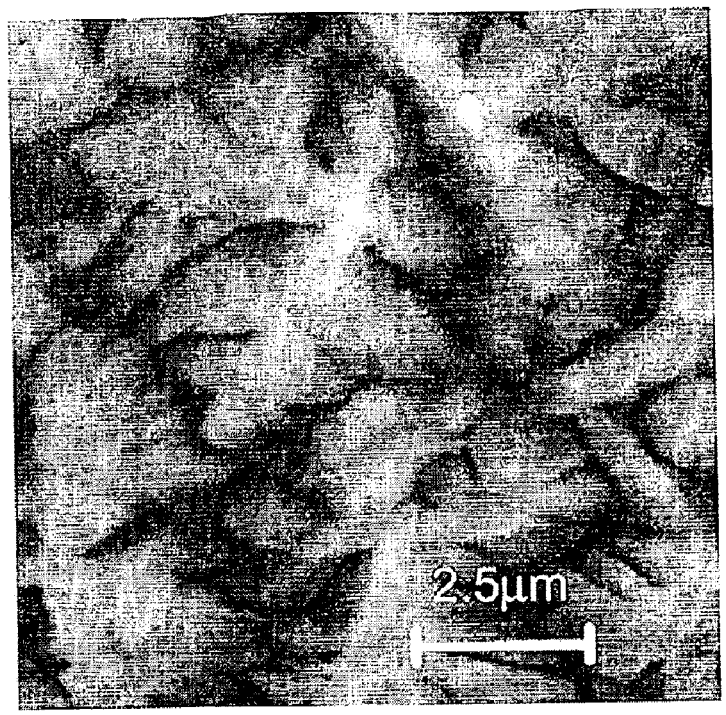
FIG. 4 is an atomic force image showing a pentacene film formed on a dielectric layer that was modified in accordance with an embodiment of the present invention.
Figure 5:
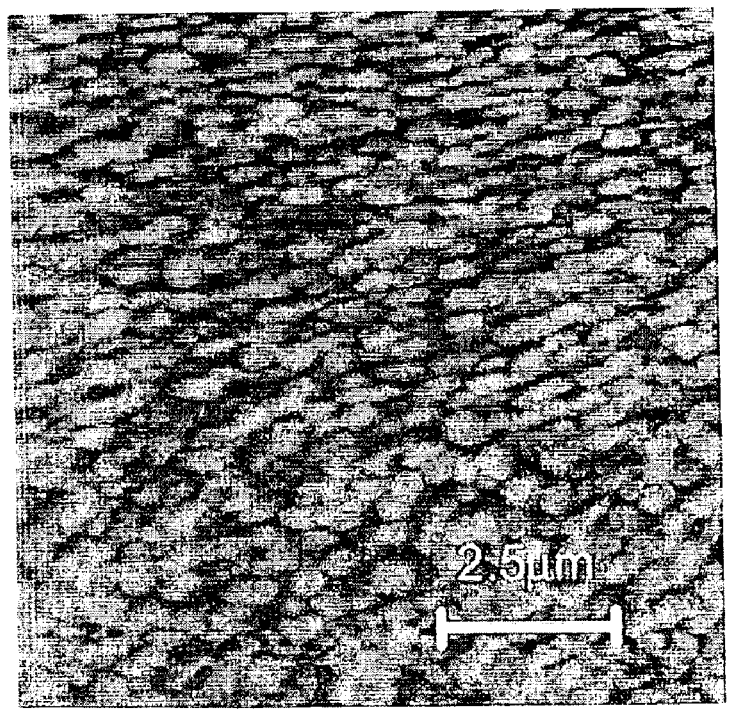
FIG. 5 is an atomic force image showing a pentacene film formed on an unmodified dielectric layer.

FIG. 4 is an atomic force image showing a pentacene film directly deposited on an amorphous silicon nitride dielectric layer formed on a glass substrate and having a thickness of 100 nm that was modified in accordance with the present invention. For comparison purposes, FIG. 5 is an atomic force image showing a pentacene film formed on an unmodified amorphous silicon nitride dielectric layer. The peak-to-valley roughness of the unmodified silicon nitride film is 5.5 nm. Referring to FIG. 4, the silicon nitride has been treated by argon plasma before depositing the organic material. The average roughness is reduced to 2.7 nm. The pentacene film has a thickness of 70 nm. As indicated by FIGS. 4 and 5, dielectric surface treatment performed in accordance with the present invention results in a drastic increase of pentacene crystal size. The improved crystal size again results in a distinct increase of electron mobility within the pentacene. In particular, the mobility of organic TFTs formed in accordance with the present invention was found to distinctly increase by a factor of 30 up to 0.4 cm$^2$/Vs. Table 2 (below)

provides additional AFM data demonstrating the decreased roughness after plasma treatment.

TABLE 2

Experimental Measurements

| DIELECTRIC (Thickness & Plasma Treatment) | ROUGHNESS (Peak/Valley) | ROUGHNESS (Average) |
|---|---|---|
| Thermal Oxide | 0.5 nm | 0.15 nm |
| PECVD Silicon Nitride (100 nm) on Silicon wafer | 5.0 nm | 0.4 nm |
| PECVD Silicon Nitride (100 nm) on glass | 9.5 nm | 1.1 nm |
| PECVD Silicon Nitride (100 nm) on glass after 30 min N plasma | 2.7–3.1 nm | 0.25 nm |
| PECVD Silicon Nitride (100 nm) on glass after 90 min N plasma | 2.4 nm | 0.14 nm |

As set forth above, dielectric surface modification utilizing the plasma treatment described above leads to a reduction of dielectric surface roughness by a factor of 2 to 3. The present inventors believe that this decreased surface roughness increases the surface mobility of the subsequently formed pentacene, and allows highly ordered polycrystalline films to nucleate and grow. The inventor's measurements indicate that low performance TFTs result when the peak-to-valley roughness is in the range of 5–10 nm or greater, and high performance TFTs are obtained when the roughness is less than 5 nm. Furthermore, the inventors have found that the roughness of the silicon nitride film depends on the deposition conditions of the materials and the thickness of the film (as indicated in Table 2). With increasing thickness, the roughness of the silicon nitride film is enhanced. To achieve a suitably smooth dielectric surface, the roughness can be reduced by adjusting the plasma treatment time (e.g., as indicated in Table 2, by increasing nitrogen-based plasma treatment from 30 to 90 minutes). The impact of the plasma treatment on the device performance of the TFTs was tested by the inventors over a period of weeks. The organic film was prepared weeks after treating the dielectric with the plasma. The good results on the treated dielectrics were still found to be reproducible after this period of time.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for fabricating an organic electronic device comprising:
   depositing a dielectric material over a substrate;
   plasma treating the dielectric material; and
   depositing an organic semiconductor film over the plasma treated dielectric material,
   wherein plasma treating the dielectric material comprises utilizing a gas selected from the group consisting of Nitrogen ($N_2$) and Argon (Ar), and
   wherein plasma treating the dielectric material comprises placing the substrate in a reactor chamber maintained in a range 200 to 500 mTorr, and flowing the gas at a rate in the range of 100–200 sccm.

2. The method according to claim 1, wherein depositing the dielectric material comprises depositing one of silicon oxide, silicon nitride, and silicon oxy-nitride using a Plasma Enhanced Chemical Vapor Deposition process.

3. The method according to claim 1, further comprising forming a gate structure before depositing the dielectric material, and forming source/drain structures after depositing the organic semiconductor film.

4. The method according to claim 1, further comprising chemically treating an upper surface of the dielectric material before depositing the organic semiconductor film.

5. A method for fabricating an organic electronic device comprising:
   depositing a dielectric material over a substrate;
   plasma treating the dielectric material; and
   depositing an organic semiconductor film over the plasma treated dielectric material,
   wherein plasma treating the dielectric material comprises utilizing a gas selected from the group consisting of Nitrogen ($N_2$) and Argon (Ar), and
   wherein plasma treating further comprises sustaining a plasma until the dielectric material has a peak-to-valley surface roughness of less than 5 nm.

6. The method according to claim 1, wherein the organic semiconductor film comprises a polyacene.

7. The method according to claim 6, wherein the organic semiconductor film comprises pentacene.

8. The method according to claim 1, further comprising forming a gate structure before depositing the dielectric material, and forming source/drain structures on the dielectric material before depositing the organic semiconductor film.

9. A method for fabricating an organic electronic device comprising:
   depositing a dielectric material over a substrate;
   plasma treating the dielectric material; and
   depositing an organic semiconductor film over the plasma treated dielectric material,
   wherein plasma treating comprises sustaining a plasma until the dielectric material has a peak-to-valley surface roughness of less than 5 nm.

10. The method according to claim 9, wherein depositing the dielectric material comprises depositing one of silicon oxide, silicon nitride, and silicon oxy-nitride using a Plasma Enhanced Chemical Vapor Deposition process.

11. The method according to claim 9, wherein plasma treating the dielectric material comprises utilizing a gas selected from the group consisting of Nitrogen ($N_2$) and Argon (Ar).

12. The method according to claim 11, wherein plasma treating the dielectric material comprises placing the substrate in a reactor chamber maintained in a range of 200 to 500 mTorr, flowing the gas at a rate in the range of 100–200 sccm.

13. The method according to claim 9, wherein the organic semiconductor film comprises a polyacene.

14. The method according to claim 13, wherein the organic semiconductor film comprises pentacene.

15. The method according to claim 9, further comprising forming a gate structure before depositing the dielectric material, and forming source/drain structures on the dielectric material before depositing the organic semiconductor film.

16. The method according to claim 9, further comprising forming a gate structure before depositing the dielectric material, and forming source/drain structures after depositing the organic semiconductor film.

17. The method according to claim 9, further comprising chemically treating an upper surface of the dielectric material before depositing the organic semiconductor film.

* * * * *